United States Patent [19]

Suzuki et al.

[11] Patent Number: 5,783,459
[45] Date of Patent: Jul. 21, 1998

[54] METHOD FOR FABRICATING A SEMICONDUCTOR DEVICE

[75] Inventors: Tamotsu Suzuki, Kawasaki; Kouichi Kawahara, Satsuma-gun, both of Japan

[73] Assignees: Fujitsu Limited, Kawasaki; Kyushu Fujitsu Electronics Limited, Satsuma-gun, both of Japan

[21] Appl. No.: 193,747

[22] Filed: Feb. 9, 1994

[30] Foreign Application Priority Data

May 20, 1993 [JP] Japan .................................. 5-117482

[51] Int. Cl.⁶ ..................... H01L 21/312; H01L 21/461
[52] U.S. Cl. ..................... 437/194; 437/229; 156/659.11
[58] Field of Search ..................... 437/194, 229, 437/195; 156/659.11, 643.1, 656.1

[56] References Cited

U.S. PATENT DOCUMENTS 5,397,432  3/1995  Konno et al. .

FOREIGN PATENT DOCUMENTS 0 452 966 A2  10/1991  European Pat. Off. .
04-278535     10/1992  Japan .

OTHER PUBLICATIONS

S.C. Lee et al. "Effects of Deep UV Radiation on Photoresist in Al" Emerging Semicond. Tech. ASTM Special Tech. Publication No. 960 (1987) pp. 250–256.

A. Gutmann et al "Thermal Stability and Etching Resistance of Formaldehyde and Deep UV Hardened Photoresists" Microelectron. Eng. vol. 3 No. 1–4 (Dec. 1985) pp. 329–337.

Abstract of Japanese Patent Appln. No. 2-71520, dated Mar. 12, 1990.

*Primary Examiner*—John Niebling
*Assistant Examiner*—C. Everhart
*Attorney, Agent, or Firm*—Nikaido, Marmelstein, Murray & Oram LLP

[57] ABSTRACT

A metal wiring is fabricated for a semiconductor device by fabricating an metal layer made of, a aluminum alloy on a semiconductor substrate through an insulation layer and an undercoating layer for the metal layer, optically patterning a resist layer for producing a resist pattern, radiating ultraviolet rays onto the resist pattern for curing the resist pattern so that the resist pattern becomes a cured resist pattern, etching the metal layer with reactive gas including chlorine by using the cured resist pattern as a mask so as to produce a metal wiring under the cured resist pattern and ashing the cured resist pattern by down flow ashing of oxygen gas including hydrogen and/or hydrogen monoxide, producing the metal wiring to the semiconductor device, wherein the curing by radiation with ultraviolet rays reduces the amount of decomposed polymer on the pattern resist, and therefore on the metal wiring, which would otherwise have formed as a result of this down flow ashing with oxygen.

18 Claims, 3 Drawing Sheets

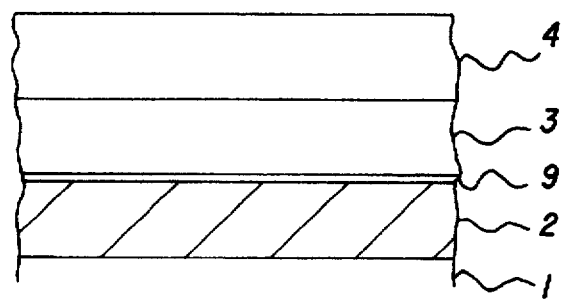
FIG.1(a) PRIOR ART
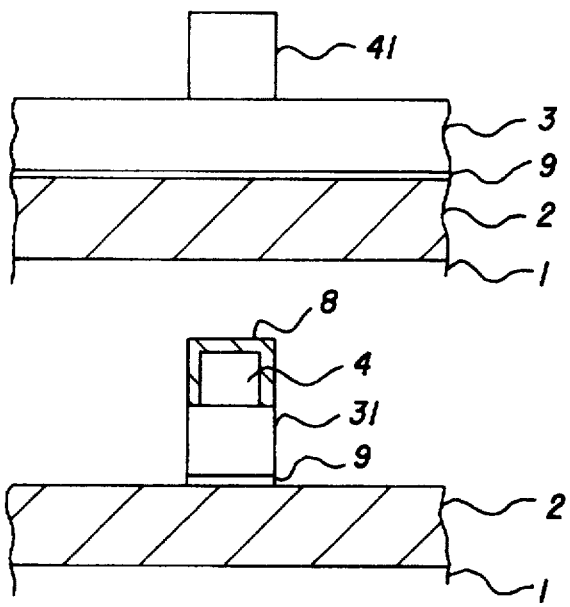
FIG.1(b) PRIOR ART
FIG.1(c) PRIOR ART
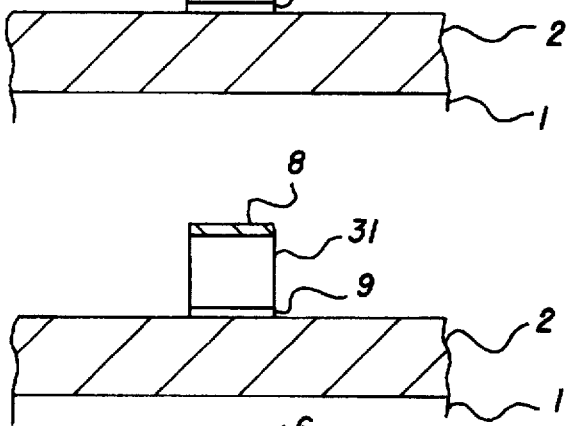
FIG.1(d) PRIOR ART
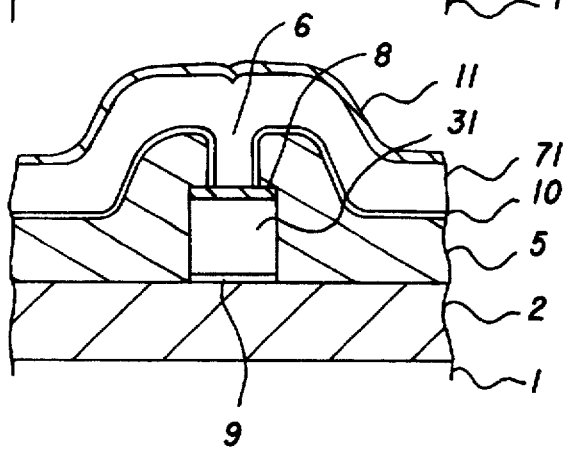
FIG.1(e) PRIOR ART

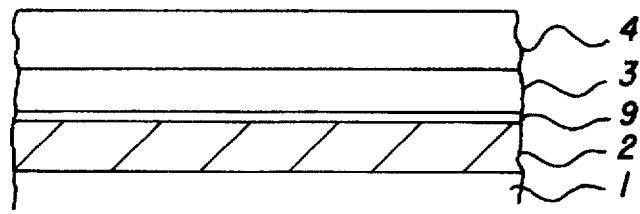
FIG.2(a)
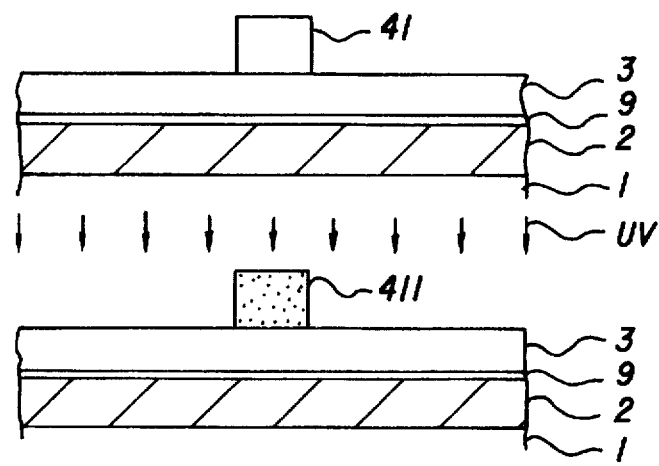
FIG.2(b)
FIG.2(c)
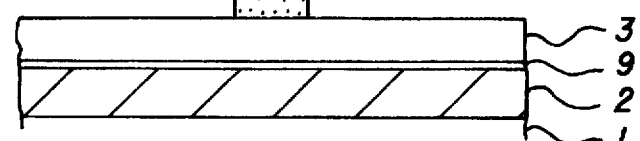
FIG.2(d)
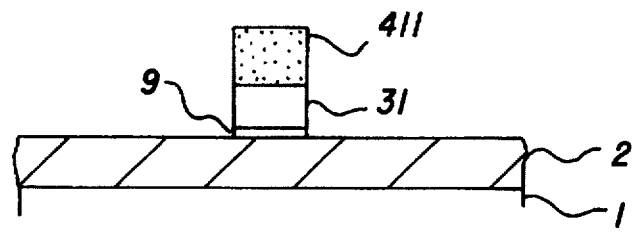
FIG.2(e)
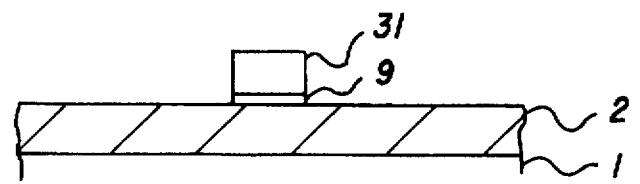
FIG.2(f)
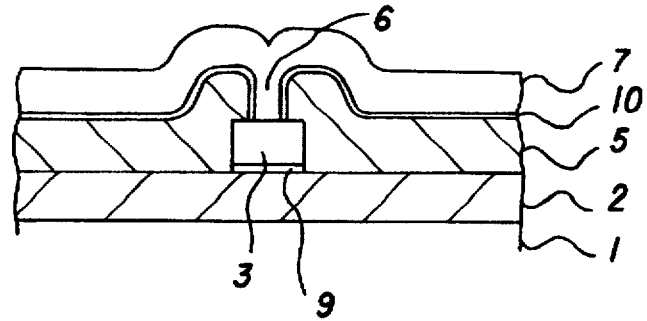

METHOD FOR FABRICATING A SEMICONDUCTOR DEVICE

BACKGROUND OF THE INVENTION

1. Field of the Invention

The present invention relates to a method for fabricating a semiconductor device, and in particular, the present invention relates to a method for fabricating metal wiring to a semiconductor device by metal dry etching performed by using a resist pattern as a mask, with reactive gas including chlorine and by ashing the resist pattern by down flow plasma of oxygen gas including hydrogen and/or hydrogen monoxide.

Metal wiring provided in a semiconductor device is fabricated by a process comprising a resist patterning step, a metal dry etching step and a resist ashing step. In the resist patterning step, a resist layer, O fabricated on a metal layer which has in turn been sputtered or evaporated on a semiconductor substrate through an undercoating layer, is optically patterned so as to produce a resist pattern. The metal layer is made of aluminum or aluminum alloy including copper. Copper or copper alloy, or tungsten alloy can be also used as the metal layer. In the metal dry etching step, the metal layer is etched with reactive gas including chlorine, leaving the metal layer, which becomes a metal wiring, under the resist pattern. In the ashing step, the resist pattern is ashed by a down flow plasma of an ashing gas including oxygen, leaving the metal wiring on the semiconductor substrate through the undercoating layer.

Since the metal dry etching is performed using a reactive gas including chlorine, chlorine become stuck to exposed surfaces of the residual, unetched metal wiring during the dry etching step. Therefore, when a wired semiconductor substrate is contracted with air, after the dry etching step, moisture in the air reacts with the chlorine stuck to the surface of the metal wiring, producing hydrochloric acid on the surface of the metal wiring. The hydrochloric acid causes the metal wiring to corrode. When aluminum alloy including copper is used as the metal layer, the corrosion of the metal wiring increases. In particular, when the metal layer is made of aluminum alloy including copper and the under coating is made of one layer made of titanium nitride or made a respectively by two layers made of titanium and titanium nitride so that the titanium is adjacent to the semiconductor substrate, the corrosion of the metal wiring becomes serious.

At the present time, as the density of integrated circuits has increased in semiconductor devices, the metal wiring must be fabricated very minutely, such as less than 1 micrometer in width. Therefore, corrosion of the metal wiring is a great problem to a semiconductor device having a high density integrated circuit, for increasing yield rate and reliability of the semiconductor device.

However, the problem due to the corrosion has been overcome by applying a new ashing method for ashing the resist pattern, which prevents the corrosion from occurring. The new ashing method will be called "incorrodible ashing method" hereinafter for distinguishing it from the usual ashing method. In accordance with the incorrodible ashing method, ashing is performed with a down flowing oxygen ashing gas including hydrogen (H) and/or hydrogen monoxide (OH). By virtue of mixing H and/or OH with the oxygen ashing gas, the H and/or OH reacts with the chlorine that is stuck on the surface of the metal wiring, producing gaseous hydrogen chloride during the ashing step. The gaseous hydrogen chloride can be exhausted from an ashing chamber so that no hydrochloric acid remains on the metal wiring and no corrosion takes place. Applying the incorrodible ashing method to the resist ashing step, the corrosion of the metal wiring can be stopped from occurring very effectively. For example, previously corrosion was observed on the metal wiring after only one hour exposure of the metal wiring to air. However, by applying the incorrodible ashing method, no corrosion is observed even though two weeks have passed since the metal wiring was exposed in the air. The incorrodible ashing method was this subject of a paper given at SPIE's (Symposium on microelectronic Processing Integration Engineerings) 1991 by F. Harada, T. Kondo, J. Konno, S. Shinagawa, and T. Takada at San Jose, Calif., U.S.A. in 1991. The patent application on the incorrodible ashing method was filed in the U.S. Patent Office under Ser. No. 743,383 and in the European Patent Office under Application No. 91911946.1.

When metal dry etching is performed on the metal layer made of aluminum or aluminum alloy, using a reactive gas including chlorine, aluminum chloride ($AlCl_3$) is produced during etching. This aluminum chloride and the resist chemically react to produce, a decomposed polymerized film on a surface of the resist pattern. The decomposed polymerized film can be ashed by the usual ashing method without any difficulty. However, the decomposed polymerized film is hard to ash when the incorrodible ashing method is used as the resist ashing step. Furthermore, the decomposed polymerized film left on the metal wiring, cannot be removed in the resist ashing step when the metal wiring is chemically treated by using concentrate nitric acid. The chemical treatment is usually required to be performed before the fabrication of another metal wiring on the present metal wiring.

The unashed decomposed polymerized film has unstable resistance. Therefore, when the metal wiring covered by the decomposed polymerized film is connection with an electrode for connected with another circuit, for example, another metal wiring, the decomposed polymerized film gives unstable conductivity to the electrode. In other words, because of the decomposed polymerized film remaining on the metal wiring, the yield rate and reliability of the semiconductor device decreases. This has been a problem to be solved.

2. Description of the Related Art

FIGS. 1(a) to 1(e) are partial cross sectional views of a semiconductor device which is in the process of having multi metal wiring disposed thereon. In the process, the semiconductor device is fabricated by a related art method as described bellow in reference to FIGS. 1(a) to 1(e).

FIG. 1(a) shows a first step at which a first insulation layer (2) is fabricated on a semiconductor substrate (1), a first undercoating layer (9) is fabricated on the first insulation layer 2, a first metal layer (3) is sputtered or evaporated on the first undercoating layer (9) and a resist layer (4), which is a positive resist layer in FIG. 1(a), is fabricated on the first metal layer (3).

The semiconductor substrate 1 is made of semiconductor material: e.g. silicon, and includes semiconductor elements not depicted in FIG. 1(a). The first insulation layer 2 is made of insulation material: e.g. silicon dioxide, and has contact holes not depicted in FIG. 1(a). The first undercoating layer 9 is made of high melting point metal: e.g. titanium in the case of one layer, and titanium and titanium nitride repectively in case of two layers, so that a layer made of titanium is disposed on the first insulation layer 2. The first metal layer 3 is made of highly electrically conductive metal: e.g.

aluminum alloy including copper. The resist layer 4 is made of photosensitive material.

FIG. 1(b) shows a second step corresponding to the resist patterning step. The resist layer 4 is optically patterned by using ultraviolet rays (UV rays) having a wavelength, such as 365 nanometer (nm) at room temperature or 436 nm at 100° C., so that a resist pattern 41 is produced on the first metal layer 3.

FIG. 1(c) shows a third step corresponding to the metal dry etching step. In accordance with a metal dry etching method, such as a reactive ion etching method, the first metal layer 3 is etched by a plasma of a reactive gas including chlorine, using the resist pattern 41 as a mask. By virtue of the metal dry etching, a first metal wiring (31) is fabricated under the resist pattern 41, however, a decomposed polymerized film (8) is produced on a surface part of the resist pattern 41. The decomposed polymerized film 8 is produced because of chemical reaction between resist and aluminum chloride produced during the metal dry etching.

FIG. 1(d) shows a fourth step corresponding to the resist ashing step. In accordance with the incorrodible ashing method, the resist pattern 41 is ashed by a down flow plasma of oxygen reactive gas including H or OH, such as an oxygen reactive gas including water vapor ($H_2O$). Applying the incorrodible ashing method, chlorine stuck to the first metal wiring 31 produced in the metal dry etching step is combined with H or OH, producing gaseous hydrogen chloride which is exhausted from the ashing chamber, not depicted in FIG. 1(d), whereby not producing hydrochloric acid proximate to the first metal wiring 31. This results in producing no corrosion of the metal wiring 31. However, the decomposed polymerized film 8 is not ashed by the incorrodible ashing method, leaving a decomposed polymerized film 8 on the first metal wiring 31.

FIG. 1(e) shows a fifth step for fabricating multi metal wiring on the semiconductor substrate 1. In FIG. 1(e), a second insulation layer (5) is formed on the first insulation layer 2 and on the first metal wiring 31, providing a contact hole (6) in the second insulation layer 5. Then, a second metal wiring (71) is fabricated on the second insulation layer 5 through a second undercoating layer (10), so that the first metal wiring 31 comes in contact with the second metal wiring 71 through metal filled in the contact hole 6. In order to form the second metal layer 71, the same method and the same material can be applied and used respectively as described in reference to FIGS. 1(a) to 1(d).

By practicing the above first to fifth steps, since the incorrodible ashing method is applied in the resist ashing step as shown in FIG. 1(d), the corrosion of the metal wiring due to hydrochloric acid is prevented from occurring. However, the decomposed polymerized film 8 is left on the upper surface of the first metal wiring 31 as shown by the hatched part in FIGS. 1(d) and 1(e), and another decomposed polymerized film (11) is left on an upper surface of the second metal wiring 71 as shown by a hatched part on the second metal wiring 71 in FIG. 1(e).

The decomposed resist layer is not electrically conductive and is difficult to be removed from the metal wiring by the incorrodible ashing and undiluted nitric acid treatment performed on the first metal wiring 31. The undiluted nitric acid treatment, which has not been described in reference to FIG. 1(e), is necessary to be performed on the first metal wiring 31 before applying the second metal wiring 71. As a result, when the first metal wiring 31 is connected with the second metal wiring 71, through the contact hole 6 as shown in FIG. 1(e), the decomposed polymerized film 8 left on the upper surface of the first metal wiring 31 causes the electric conduction between the first metal wiring 31 and the second metal wiring 71 to be deteriorated or even lost completely. Thus, the decomposed polymerized film causes yield rate and reliability of the semiconductor device to decrease, which has been a problem to be solved.

SUMMARY OF THE INVENTION

Therefore, an object of the present invention is to improve the method for fabricating a semiconductor device so that no decomposed polymerized film is produced after the resist ashing is performed with an oxygen ashing gas including hydrogen and/or hydrogen monoxide.

Another object of the present invention is to the increase yield rate and reliability of the semiconductor device.

These objects are accomplished by improving the metal dry etching method so as not to produce the decomposed polymerized film in the metal dry etching step. The improvement of the metal dry etching method is accomplished by curing the resist pattern so as to produce a cured resist pattern at the beginning of the metal dry etching step. The cured resist pattern is produced by radiating UV rays, which will be called "curing UV rays" hereinafter, onto the residual resist pattern after the resist patterning step is over. Then, the metal dry etching is performed with a reactive gas including chlorine, using the cured resist pattern as a mask. The curing UV rays are radiated on the resist pattern in circumstances of inert gas or air, or in a vacuum if possible.

It has been experimentally verified that the resist pattern cured according to this invention can be ashed in the resist ashing step, carried out with an oxygen ashing gas including H and/or OH, without leaving any decomposed polymerized film and without producing any corrosion due to the formation of hydrochloric acid.

Improving the fabricating method of the semiconductor device thus, the electric connection between multiple metal wires can be made with low stable resistance across the connection, which increases yield rate and reliability of the semiconductor devices.

BRIEF DESCRIPTION OF THE DRAWINGS

FIG. 1(a) is a partial cross sectional view of a semiconductor device to be fabricated by a related art method, in which a first insulation layer, a first undercoating layer, a first metal layer and a resist layer are sequentially disposed on a semiconductor substrate, respectively;

FIG. 1(b) is a partial cross sectional view of a semiconductor device in which the first resist layer has been patterned so as to produce a resist pattern;

FIG. 1(C) is a partial cross sectional view of a semiconductor device in which the first metal layer has been etched with a reactive gas including chlorine, leaving a first metal wiring under the resist pattern and producing a decomposed resist layer at a surface part of the resist pattern;

FIG. 1(d) is a partial cross sectional view of a semiconductor device in which the resist pattern has been ashed, leaving the decomposed polymerized film on the first metal wiring;

FIG. 1(e) is a partially cross sectional view of a semiconductor device in which a second metal wiring has been disposed on the first metal wiring;

FIG. 2(a) is a partial cross sectional view of a semiconductor device to be fabricated by a fabricating method of the present invention, in which a first insulation layer, a first undercoating layer, a first metal layer and a resist layer are fabricated on a semiconductor substrate, respectively;

FIG. 2(b) is a partial cross sectional view of a semiconductor device in which the first resist layer has been patterned so as to produce a resist pattern;

FIG. 2(c) is a partial cross sectional view of a semiconductor device in process of curing the resist pattern for producing a cured resist pattern, by radiating curing UV rays onto the resist pattern;

FIG. 2(d) is a partial cross sectional view of a semiconductor device in which the first metal layer has been etched with a reactive gas including chlorine, leaving a first metal wiring under the cured resist pattern;

FIG. 2(e) is a partial cross sectional view of a semiconductor device in which the cured resist pattern has been ashed, leaving the first metal wiring exposed;

FIG. 2(f) is a partial cross sectional view of a semiconductor device in which a second metal wiring has been disposed on the first metal wiring;

DESCRIPTION OF THE PREFERRED EMBODIMENT

Figure 3A:
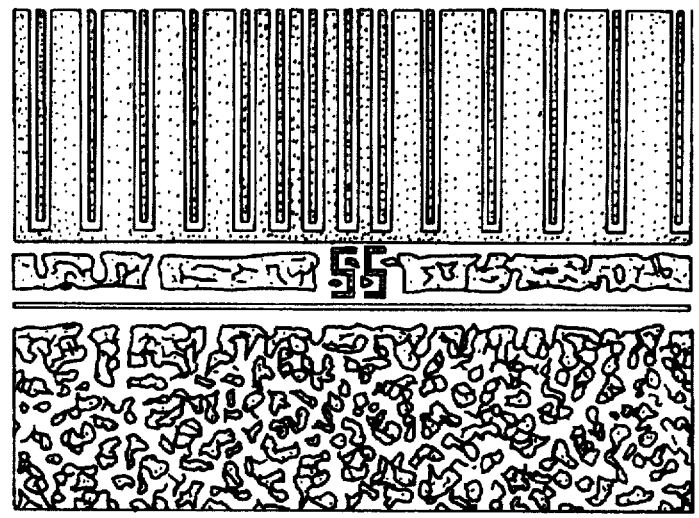
FIG. 3(a) is a plan photograph of a partial metal wiring experimentally fabricated on a semiconductor device, after curing a surface part of a resist pattern by curing UV rays, etching a metal layer with a reactive gas including chlorine for producing a metal wiring and ashing the resist pattern partially cured with oxygen ashing gas including hydrogen and/or hydrogen monooxide.

FIGS. 2(a) to 2(f) are partial cross sectional views of a semiconductor device, for showing a method of a preferred embodiment of the present invention for fabricating the semiconductor device. In FIGS. 2(a) to 2(f), the same reference numeral as in FIGS. 1(a) to 1(e) designates the same part as in FIGS. 1(a) to 1(e).

FIG. 2(a) shows a first step which is the same as the first step described in reference to FIG. 1(a). In the first step shown in FIG. 2(a), a first insulation layer 2 having contact holes, not depicted in FIG. 2(a), is fabricated on the semiconductor substrate 1, including semiconductor elements not depicted in FIG. 2(a). The first metal layer 3 is sputtered or evaporated on the first insulation layer 2, and the resist layer 4, which is a positive resist layer in FIG. 2(a), is fabricated on the first metal layer 3. In FIG. 2(a), the first insulation layer 2 is made of silicon dioxide (SiO$_2$) which has been fabricated by a Chemical Vapour Deposition (CVD) method so as to be 1 micrometer in thickness, the first metal layer 3 is made of aluminum alloy, including a small quantity of copper, which has been fabricated so as to be 1 micrometer in thickness, and the resist layer 4 is made of photosensitive material so as to be approximately 2 micrometers in thickness.

FIG. 2(b) shows a second step which is the same as the second step described in reference to FIG. 1(b). The second step shown in FIG. 2(b) corresponds to the resist patterning step in which the resist layer 4 is optically patterned by using UV rays, which will be called "patterning UV rays" hereinafter, having a wavelength, such as 365 nm at room temperature or 436 nm at 100° C., so that a resist pattern 41 is produced covering a portion of the first metal layer 3.

FIG. 2(c) shows a third step which is the point of the present invention. In the third step, the resist layer 41 is cured by being subjected to curing UV rays radiated onto the resist pattern 41, for preventing a decomposed polymerized film (as shown in FIG. 1) from being produced on the resist pattern 41 during the metal dry etching step carried out with reactive gas including chlorine. The metal dry etching will be described next in reference to FIG. 2(d). In the third step, the curing UV rays are radiated onto the resist pattern 41 heated up to 100° C.~170° C., in air. In order to cure the inner part of the resist layer 41 sufficiently, the curing UV rays are radiated several times with different wavelengths, selected from wavelengths of from 180 nm to 330 nm. For example, the radiation is performed three times, initially with a long wavelength, such as 300 nm, next with a medium wavelength, such as 250 nm, and last with a short wavelength, such as 210 nm. When the curing UV rays are radiated with 700 mW~1000 mW power in approximately 90 sec, the resist layer 41 approximately 1.5 micrometer in thickness is cured. In order to prevent the decomposed polymerized film from being produced on the resist pattern 41, it is required to cure the resist pattern to a depth of at least 1 micrometer. FIG. 2(c) shows a case where the resist pattern 41, which is 2 micrometer thick is cured completely. It is better to increase the temperature of the resist pattern for accelerating curing. However, it is desirable to set the temperature within the above 100° C.~170° C. range in order to prevent the resist pattern 41 from being changed in shape.

By virtue of radiating the curing UV rays, the resist pattern 41 is cured so as to become a cured resist pattern (411) as stippled in FIG. 2(c).

FIG. 2(d) shows a fourth step corresponding to the metal dry etching step shown in FIG. 1. The metal dry etching is performed on the first metal layer 3 by a reactive ion etching method with a reactive gas comprising chlorine, for example the reactive gas includes chlorine and boron trichloride (Cl+BCl$_3$), using the cured resist pattern 411 as a mask. As a result, exposed portions of the first metal layer 3 are removed, leaving the first metal wiring 31 disposed under the cured resist pattern 411. Further, since the cured resist pattern 411 is provided instead of the resist pattern 41 and the cured resist pattern 411 does not react with aluminum trichloride produced in the metal dry etching step, no decomposed polymerized film is produced on the cured resist pattern 411.

FIG. 2(e) shows a fifth step corresponding to the resist ashing step. In FIG. 2(e), the cured resist pattern 411 is ashed by the incorrodible ashing method so that the first metal wiring 31 is disposed at an upper surface of the first insulation layer 2. That is, the cured resist pattern 411 is ashed by a down flow plasma of oxygen reactive ashing gas including H and/or OH. For example, the resist ashing step is carried out using 1 KW power in the presence of a down flow plasma of ashing gas which includes oxygen (O$_3$) and water vapor (H$_2$O), preferably in a ratio of O$_2$/H$_2$O of 1000/100 1~2 Torr pressure. Applying the incorrodible ashing method, the chlorine produced in this third step is reacted with H or OH, producing gaseous hydrogen chloride which is exhausted from an ashing chamber, by means not depicted in FIG. 2(e).

FIG. 2(f) shows a sixth step for fabricating multiple metal wires on the semiconductor substrate 1. In FIG. 2(f), a second insulation layer 5 is formed on upper surfaces of the first insulation layer 2 and the first metal wiring 31, while providing a contact hole 6 in the second insulation layer 5. A second metal wire 71 is fabricated on the second insulation layer 5 so that the first metal wire 31 comes in contact with the second metal wire 71 through the contact hole 6 filled with metal. In order to form the second metal layer 71, the same process as described in reference to FIGS. 2(a) to 2(d) can be applied. Since no decomposed polymerized film is produced on the cured resist pattern 411 in the metal dry etching step and the cured resist pattern 411 can be ashed completely in the resist ashing step, the first metal wire 31 and the second metal wire 71 can be firmly contacted with each other, with a small contact resistance, at the contact hole 6.

Figure 3B:
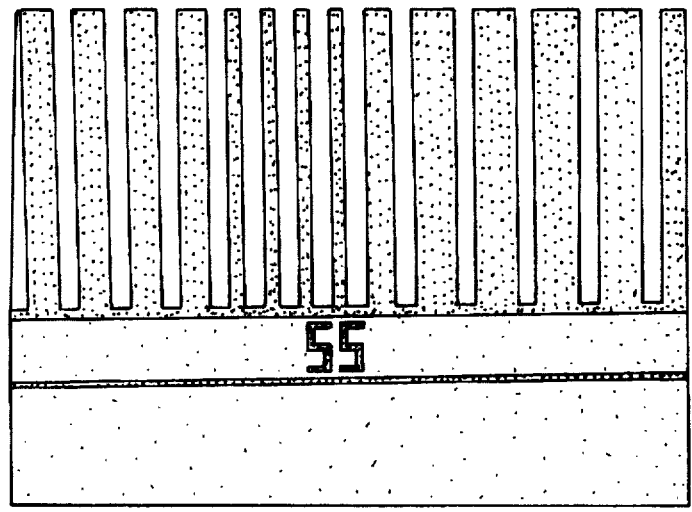
FIG. 3(b) is a plan photograph of a partial metal wiring experimentally fabricated on a semiconductor device by a preferred aspect of this invention, after curing a resist pattern completely by curing UV rays, for producing a cured resist pattern, etching a metal layer with reactive gas including chlorine, for producing a metal wiring, and ashing the cured resist pattern with oxygen ashing gas including hydrogen and/or hydrogen monooxide.

An example of a case where a decomposed polymerized film is produced on a cured resist pattern is shown in FIG. 3(a), and another example of a case where no decomposed polymerized film is produced on the cured resist pattern is shown in FIG. 3(b). FIGS. 3(a) and 3(b) are photomicrographs of upper surfaces of the aluminum wiring disposed on the semiconductor devices, viewed from above just after the resist ashing step is over respectively. In FIGS. 3(a) and 3(b), the photomicrographs are of semiconductor devices which were made under the same fabricating conditions. That is, the curing UV rays are radiated on the resist pattern before the metal dry etching step, the metal dry etching is performed with reactive gas including chlorine and the resist ashing is performed with down flow plasma of oxygen gas including water vapor.

FIG. 3(a) shows a case where the curing is performed on the resist pattern by the curing UV rays, but only to the surface part of the resist pattern, not to the inner part of the resist pattern. As a result, in the metal dry etching step, the cured part of the resist pattern surface is partially removed by the plasma, so that the inner part of the resist, which is not cured, becomes exposed on the surface of the resist pattern. The portion of the resist which has not been cured and therefore come out on the surface of the resist pattern reacts with aluminum chloride produced by etching, so that some decomposed polymerized film is produced on the metal wiring. Some decomposed polymerized film remains left on the metal wiring even though the resist ashing is over. The residual decomposed polymerized film is shown by a crack pattern in FIG. 3(a).

FIG. 3(b) shows a case where the curing of the resist pattern is completed by subjecting the resists to changing wavelength of the UV rays as described in the third step in reference to FIG. 2(c). As a result, in the metal dry etching step, no decomposed polymerized film is produced, only the surface of the cured resist pattern is obtained, and the cured resist pattern is completely ashed at the resist ashing step. Therefore, a fine surface of the metal wiring is obtained after the resist ashing step, as shown in FIG. 3(b).

In the preferred embodiment described above, a positive resist is applied to the resist patterning step. However, the present invention can be applied to a case where a negative resist is applied to the resist patterning step.

What is claimed is:

1. A method for forming a metal wiring, comprising aluminum, on a semiconductor substrate said method comprising the steps of:

disposing an insulation layer on a semiconductor substrate;

disposing an undercoating layer on the insulating layer;

disposing a metal layer, comprising aluminum, on the undercoating layer;

disposing a resist layer on the metal layer;

impinging first ultra violet radiation on the resist layer to produce a resist pattern on the metal layer;

developing said optically patterned resist layer to form a resist pattern mask which exposes a portion of said metal layer therethrough;

irradiating said resist pattern mask with a plurality of curing second ultraviolet rays of different wavelengths whereby producing a cured resist pattern mask;

etching the metal layer, with reactive gas including chlorine, through the cured resist pattern mask, leaving metal in the shape of wiring under the cured resist pattern mask;

wherein, in the absence of said irradiating with said second ultraviolet curing radiation, said etching is carried out under conditions which would produce aluminum chloride reacting with said resist pattern mask to form a decomposed polymer on said mask; and thereafter ashing the cured resist pattern mask with ashing gas comprising oxygen and at least one of hydrogen and hydrogen monoxide;

wherein said plurality of second ultraviolet rays which are impinged on said resist pattern mask are in an amount, for a time, and of a plurality of wavelengths sufficient to cure the resist pattern mask to an extent sufficient to at least reduce the amount of a decomposed polymer, which is not ashed to a substantial extent by reaction with said ashing gas, comprising oxygen and at least one member selected from the group consisting of hydrogen (H) and hydrogen oxide (OH), which would otherwise be formed of at least a portion of said resist pattern mask upon etching said metal layer with said reactive gas comprising chlorine.

2. A method according to claim 1, wherein said step of radiating curing ultraviolet rays onto the resist pattern is performed in an air atmosphere.

3. A method according to claim 1, wherein said step of radiating curing ultraviolet rays onto the resist pattern is performed in a vacuum.

4. A method according to claim 1, wherein said radiating curing ultraviolet rays have wavelengths of about 180 nm to 330 nm.

5. A method according to claim 4, wherein said curing ultraviolet rays are radiated onto said patterned resist in a sequence rays of decreasing wavelengths.

6. A method according to claim 1, wherein said step of radiating curing ultraviolet rays onto the resist pattern is performed at a temperature of the resist pattern of 100° C.~170° C.

7. A method according to claim 1, wherein said step of radiating ultraviolet rays onto the resist pattern is performed for a time and with a plurality of wavelengths of ultraviolet rays sufficient to cure the resist pattern to a depth of at least 1 micrometer.

8. A method according to claim 1, wherein said undercoating layer comprises titanium.

9. A method according to claim 1, wherein the undercoating layer comprises two layers, one of which comprises titanium nitride and the other of which comprises titanium.

10. A method according to claim 5, wherein said sequence of curing ultraviolet ray radiations are all in descending wavelength order.

11. A method according to claim 10 wherein a first of said curing ultraviolet rays is at a wavelength of 300 nm; a second of said curing ultraviolet rays is at a wavelength of 250 nm; and a third of said curing ultraviolet rays is at a wavelength of 210 nm.

12. A method according to claim 1 wherein said radiation curing is to a depth of at least one half the thickness of said patterned resist.

13. A method according to claim 5, wherein said radiation curing is throughout substantially the whole thickness of said patterned resist.

14. In the method of forming wires on a semiconductor substrate which comprises:
 disposing an insulation layer on a semiconductor substrate;
 disposing an undercoating layer on said insulation layer;
 disposing a film of wire metal, comprising aluminum, on said undercoating layer;
 disposing a resist layer of said wire metal layer;
 impinging first ultra violet radiation on the resist layer to produce an optically patterned resist on the metal layer;
 developing said optically patterned resist to form a resist pattern mask which exposes a portion of said metal layer therethrough;
 etchingly removing exposed wire metal by impinging a reactive gas comprising chlorine on said metal in an amount and under circumstances sufficient to form aluminum chloride and sufficient to react said formed aluminum chloride with said resist pattern mask to form decomposed polymer on said resist pattern mask, whereby leaving wire metal under said resist pattern mask; and
 ashing said resist pattern mask with a downwardly directed flow of an ashing gas, comprising oxygen and at least one of hydrogen and hydrogen monoxide, under conditions which would leave decomposed polymer on said exposed wire patterned metal;
  the improvement, whereby at least decreasing the amount of said decomposed polymer on said resist pattern mask, and therefore on said wire patterned metal, which comprises:
 impinging curing ultraviolet radiation on said resist pattern mask prior to etching said exposed wire metal layer therethrough, wherein said curing ultraviolet radiation is of a plurality of wavelengths, is for a time, and is at a temperature sufficient to convert said resist pattern mask an amount sufficient to reduce the formation of said decomposed polymer caused by reaction thereof with aluminum chloride during said metal etching.

15. In the method of forming a conducting junction between metal wires on a semiconductor substrate which comprises:
 disposing an insulation layer on a semiconductor substrate;
 disposing an undercoating layer on said insulation layer;
 disposing a film of first wire metal layer, comprising aluminum, on said undercoating layer;
 disposing a resist layer on said wire metal layer;
 impinging first ultraviolet radiation onto said resist layer and developing said resist layer to pattern said resist layer into a resist pattern mask, whereby exposing first wire metal;
 etchingly removing exposed first wire metal by impinging a reactive gas comprising chlorine on said first metal through said resist pattern mask, in an amount and under circumstances sufficient to form aluminum chloride and sufficient to react said formed aluminum chloride with said resist pattern mask to form decomposed polymer on said resist pattern mask, whereby leaving first wire metal under said resist pattern mask;
 ashing said resist pattern mask with a downwardly directed flow of an ashing gas, comprising oxygen and at least one of hydrogen and hydrogen monoxide, leaving exposed a first wire patterned first metal having decomposed polymer thereon;
 disposing a second insulating layer over said first wire patterned first metal;
 providing a hole in said second insulation sufficient to expose a portion of said first wire patterned first metal; and
 forming a second wire patterned metal on said second insulation in electrical connection with said first wire pattern first metal through said hole, wherein said electrical connection has a resistance;
  the improvement, whereby reducing the resistance in said electrical connection, which comprises:
 impinging curing second ultraviolet radiation on said resist pattern mask prior to etching said exposed first wire metal layer, wherein said curing second ultraviolet radiation is of a plurality of wavelengths, is for a time, and is at a temperature sufficient to convert said resist pattern mask an amount sufficient to at least reduce the formation of said decomposed polymer during said metal etching.

16. A method for forming a metal wiring, comprising aluminum, on a semiconductor substrate comprising the steps of:
 disposing a metal layer, comprising aluminum, over a substrate;
 disposing a resist layer on said metal layer;
 producing a resist pattern, in the shape of wiring, on said metal layer;
 developing said wire patterned resist layer to form a resist pattern mask which exposes a portion of said metal layer therethrough;
 irradiating said resist pattern mask a plurality of times with a plurality of ultraviolet rays of different wavelengths under conditions sufficient to cure said patterned resist mask;
 etchingly removing that portion of the metal layer exposed through the deep cured resist pattern mask by reacting such exposed metal with a reactive gas including chlorine, leaving metal in the shape of wiring under the cured resist pattern mask;
 wherein said etching produces aluminum chloride, which reacts with said patterned resist to form a decomposed polymer layer on said patterned resist when said patterned resist is irradiated only once with only one of said ultraviolet wavelengths of curing radiation, and
 wherein, when said patterned resist is irradiated said plurality of times with said plurality of different ultraviolet wavelengths of radiation, said patterned resist is cured to a depth of at least about 1 micrometer which depth is greater than a curing depth which is achieved by irradiating said resist pattern mask once with ultraviolet radiation of a single one of said wavelengths; and
 ashing the cured resist pattern mask with ashing gas comprising oxygen and at least one of hydrogen and hydrogen monoxide;
 wherein, when said curing radiation is a single dose of a single wavelength of ultraviolet radiation, said ashing leaves decomposed polymer, which is not ashed to a substantial extent by reaction with said ashing gas, but when said curing radiation is a plural dose of plural wavelengths of ultraviolet radiation, said ashing leaves at least less of said decomposed polymer.

17. In the method of forming wires on a semiconductor substrate which comprises:

disposing a film of wire metal, comprising aluminum, on a substrate;

disposing a resist layer on said wire metal layer;

patterning said resist on the metal layer in the form of a wire pattern;

developing said patterned resist to form a patterned resist mask which exposes a portion of said metal layer therethrough;

etchingly removing exposed wire metal, by impinging a reactive gas comprising chlorine on said metal in an amount and under circumstances sufficient to react with said metal layer and to thereby form aluminum chloride, and conditions sufficient to react said formed aluminum chloride with material of said resist pattern mask to form decomposed polymer, whereby leaving said metal in the form of a wire under said patterned resist mask; and ashing said patterned resist mask with a downwardly directed flow of an ashing gas, comprising oxygen and at least one of hydrogen and hydrogen monoxide, under conditions which substantially remove said patterned resist mask;

wherein said ashing leaves decomposed polymer on said exposed wire patterned metal;

the improvement, whereby at least decreasing the amount of said decomposed polymer produced by said ashing, which comprises:

impinging a plurality of curing ultraviolet radiations, each of a different wavelength, on said patterned resist mask prior to etching said exposed metal layer through said mask under conditions sufficient to cure said mask to a depth of at least 1 micrometer which is sufficient to at least reduce the formation of said decomposed polymer caused by reaction of said cured resist with aluminum chloride during said metal etching.

18. In the method of forming a conducting junction between metal wires on a substrate which comprises:

disposing a first wire metal layer, comprising aluminum, on said substrate;

disposing a resist layer on said metal layer;

patterning said resist layer into a resist mask, whereby exposing said first metal outside said resist mask pattern;

etchingly removing exposed first metal by impinging a reactive gas, comprising chlorine, on said first metal through said resist pattern mask whereby leaving first metal under said resist pattern mask;

wherein said etching forms aluminum chloride which reacts with said resist mask to form decomposed polymer;

ashing said resist mask with an ashing gas, comprising oxygen and at least one of hydrogen and hydrogen monoxide, leaving exposed first metal in the form of a wire having decomposed polymer thereon;

disposing an insulating layer over said first metal wire;

providing at least one hole in said insulation sufficient to expose a portion of said first wire; and forming a wire patterned second metal on said insulation in electrical connection with said wire patterned first metal through said hole(s), wherein said electrical connection has a resistance;

the improvement, whereby reducing the resistance in said electrical connection, which comprises:

impinging a plurality of curing ultraviolet rays of different wavelengths on said patterned resist mask prior to etching said exposed first metal layer, wherein said plural curing ultraviolet radiation is for a time and is at a temperature sufficient to cure said patterned resist mask an amount sufficient to at least reduce the formation of said decomposed polymer formed during said metal etching and not ashed by said ashing step.

* * * * *